(12) United States Patent
Hodes et al.

(10) Patent No.: US 7,700,183 B2
(45) Date of Patent: Apr. 20, 2010

(54) CLOSED CELL SURFACES WITH ENHANCED DRAG-REDUCTION PROPERTIES

(75) Inventors: Marc Scott Hodes, New Providence, NJ (US); Paul Robert Kolodner, Hoboken, NJ (US); Thomas Nikita Krupenkin, Warren, NJ (US); Todd Richard Salamon, Chatham, NJ (US); Joseph Ashley Taylor, Springfield, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 71 days.

(21) Appl. No.: 11/468,650

(22) Filed: Aug. 30, 2006

(65) Prior Publication Data

US 2008/0057287 A1 Mar. 6, 2008

(51) Int. Cl.
*B32B 3/26* (2006.01)
*B32B 3/06* (2006.01)
*B32B 5/14* (2006.01)

(52) U.S. Cl. .............. 428/304.4; 428/305.5; 428/307.3; 428/309.9

(58) Field of Classification Search .............. 428/304.4, 428/305.5, 307.3, 309.9
See application file for complete search history.

(56) References Cited

U.S. PATENT DOCUMENTS

| 6,349,734 B1 | 2/2002 | Babenko |
| 2004/0229963 A1 | 11/2004 | Culeron et al. |
| 2004/0253183 A1* | 12/2004 | Uber et al. .................. 424/9.52 |

FOREIGN PATENT DOCUMENTS

EP 1520622 A1 4/2005

OTHER PUBLICATIONS

EP Search Report dated Apr. 25, 2008 for PCT/US2007/018816 (EP related case); 10 pages.

* cited by examiner

*Primary Examiner*—Victor S Chang
(74) *Attorney, Agent, or Firm*—Hitt Gaines, P.C.

(57) ABSTRACT

An apparatus, comprising a plurality of closed cells disposed on a surface of a substrate. Each of the closed cells has at least one dimension that is less than about 1 millimeter and are configured to hold a medium therein. The apparatus also comprises a foam that contacts the closed cells. The foam has fluid walls that include a surfactant, and bubbles of the foam layer are filled with the medium.

13 Claims, 9 Drawing Sheets

CLOSED CELL SURFACES WITH ENHANCED DRAG-REDUCTION PROPERTIES

TECHNICAL FIELD OF THE INVENTION

The present invention is directed, in general, to a apparatus and method for controlling the flow resistance of a fluid on a surface.

BACKGROUND OF THE INVENTION

This section introduces aspects that may be helpful to facilitating a better understanding of the invention. Accordingly, the statements of this section are to be read in this light. The statements of this section are not to be understood as admissions about what is in the prior art or what is not in the prior art.

There is great interest in the use of engineered surfaces to reduce the flow resistance of a liquid on the surface. Some structured surfaces having nanometer- or micron-sized raised features have promise in applications ranging from the transport of a liquid through a channel, to reducing the drag of a vessel traveling through a liquid. However, problems must be overcome before the full benefit of these surfaces can be realized.

One problem is that the flow resistance of a liquid on a structured surface can vary dramatically with the pressure of the liquid. If the pressure of the liquid increases, then the liquid will penetrate to a greater extent into the structured surface, thereby increasing the flow resistance of the liquid on that surface. Alternatively, if the pressure of the liquid decreases, then the liquid will penetrate to a lesser extent into the structured surface, thereby decreasing the flow resistance. Flow resistance can also increase when the diffusion of air out of the liquid is sufficient to form air bubbles on the structured surface. For instance, the formation of air bubbles on a structured surface that is covering the inner surface of a pipe or channel can significantly increase the flow resistance of a liquid by partially blocking the pipe or channel cross-section.

Embodiments of the present invention overcome these deficiencies by providing an apparatus having a structured surface that facilitates formation of a foam that provides improved pressure stability and reduced flow resistance, as well as methods of using and manufacturing such an apparatus.

SUMMARY OF THE INVENTION

To address the above-discussed deficiencies, one embodiment of the present invention is an apparatus. The apparatus comprises a plurality of closed cells disposed on a surface of a substrate. Each of the closed cells has at least one dimension that is less than about 1 millimeter and is configured to hold a medium therein. The apparatus also comprises a foam contacting the closed cells. The foam has fluid walls that include a surfactant, and bubbles of the foam layer are filled with the medium.

Another embodiment is a method of use that comprises controlling the flow resistance of a fluid disposed on a surface of a substrate. The method includes contacting a fluid with a plurality of the above-described closed cells disposed on a surface of a substrate. The method further includes adjusting amounts of a surfactant and a medium in the fluid to thereby form a foam between the fluid and the closed cells.

Yet another embodiment comprises a method of manufacture. The method comprises forming a plurality of the above-described closed cells disposed on a surface of a substrate, and contacting the closed cells with a fluid. The method also includes introducing a surfactant and a medium into the fluid such that a foam forms between the fluid and the closed cells.

BRIEF DESCRIPTION OF THE DRAWINGS

The invention is best understood from the following detailed description, when read with the accompanying figures. Various features may not be drawn to scale and may be arbitrarily increased or reduced for clarity of discussion. Reference is now made to the following descriptions taken in conjunction with the accompanying drawings, in which.

DETAILED DESCRIPTION

As part of the present invention, it was recognized that structured surfaces comprising closed cell structures have excellent stability over a range of hydrodynamic pressures, but often have high flow resistance. It was further realized that the flow resistance of closed celled structures could be improved by forming a foam between the closed celled structures and bulk fluid over the closed celled structures. By separating the flow of the over-lying fluid from the closed celled structures, flow resistance is greatly diminished.

For the purposes of the present invention, closed cells are defined as nanostructures or microstructures having walls that enclose an open area on all sides except for the side over which a fluid could be disposed. The term nanostructure as used herein refers to a predefined raised feature on a surface that has at least one dimension that is about 1 micron or less. The term microstructure as used herein refers to a predefined raised feature on a surface that has at least one dimension that is about 1 millimeter or less.

The term medium, as used herein, refers to any gas or liquid that is locatable in the structured surface. The term fluid refers to any gas or liquid that is locatable in or on the structured surface. In some cases, e.g., the medium comprises a gas such as air or nitrogen located within the closed celled nano- or microstructures, and the fluid comprises a liquid such as water that is located over the closed celled nano- or microstructures.

Figure 1:
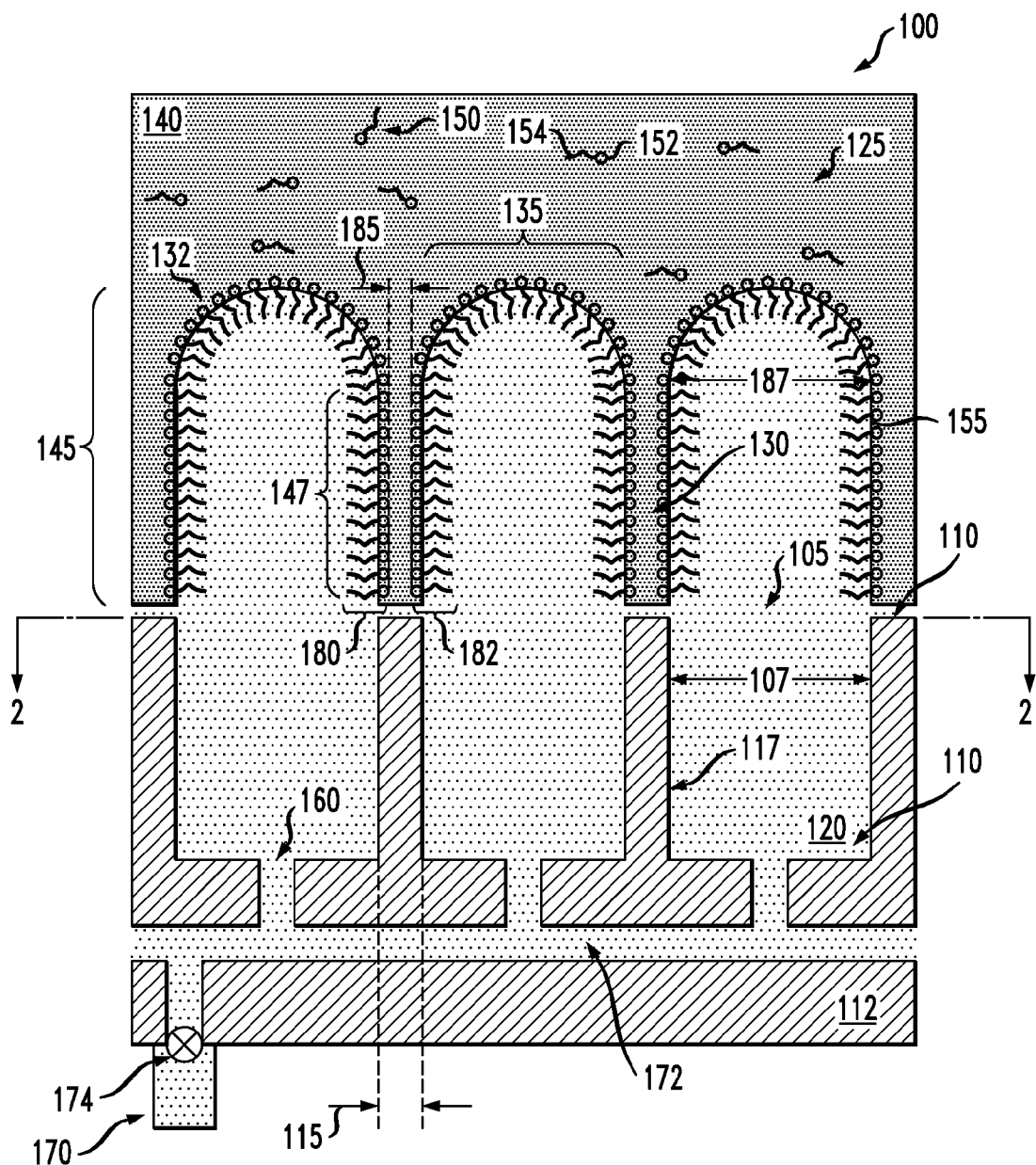
FIG. 1 presents a cross-sectional view of an example apparatus of the present invention.
Figure 2:
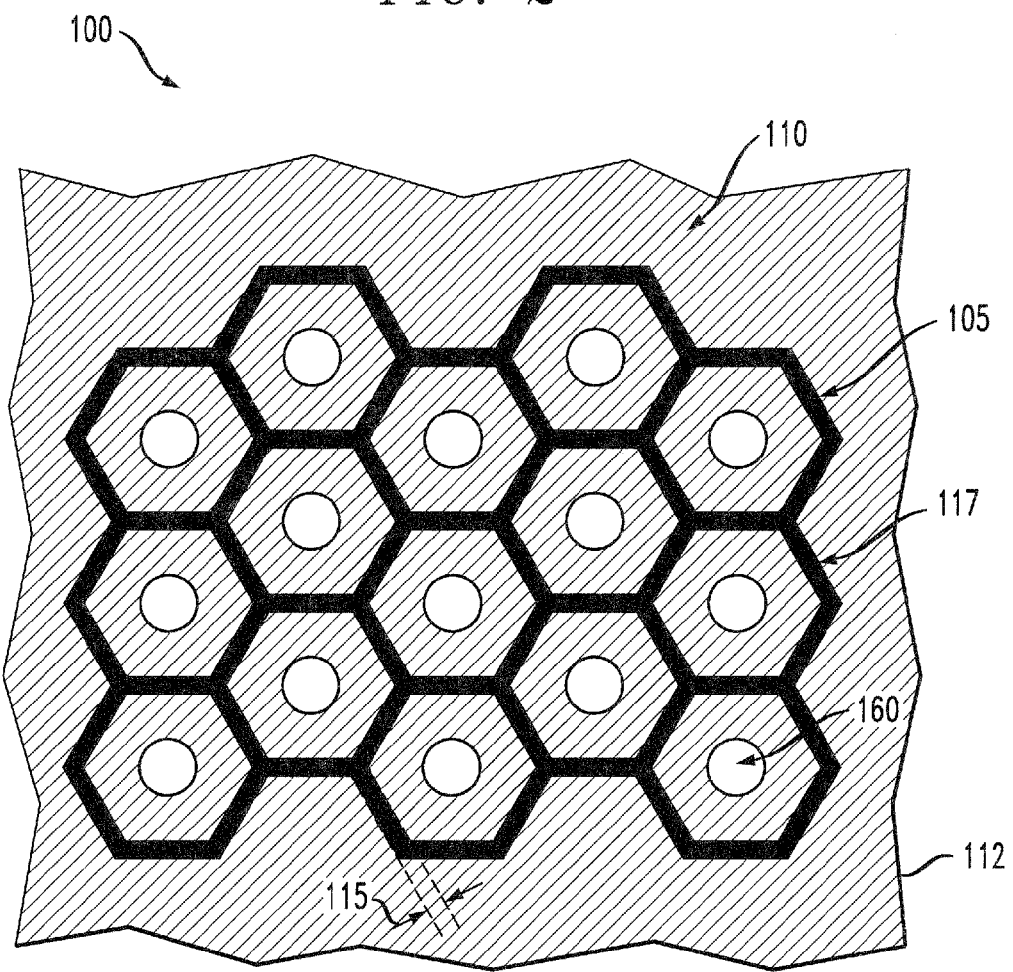
FIG. 2 shows a plan view of the example apparatus presented in FIG. 1.

One embodiment of the present invention is an apparatus. FIG. 1 presents a cross-section view of an example apparatus 100 to illustrate certain features of the present invention. FIG. 2 shows a lower magnification plan view of the apparatus 100 along view lines 2-2 in FIG. 1. For clarity, the medium and fluid are not depicted in FIG. 2.

As illustrated in FIGS. 1-2, the apparatus 100 comprises a plurality of closed cells 105 of diameter 107 are disposed on a surface 110 of a substrate 112. In some cases, the substrate 112 is a planar substrate, and more preferably, a stack of planar substrates that are in contact with each other. For instance, the substrate 112 can comprise an inorganic semiconductor, such as silicon or silicon-on-insulator (SOI) In other instances, however, the substrate 112 is a non-planar substrate, and can comprise other materials, such as plastics or metals.

Each of the closed cells 105 is a nanostructure or microstructure, e.g., they each have at least one dimension that is less than about 1 millimeter, and in some cases, less than about 1 micron. In some embodiments of the apparatus 100, such as illustrated in FIGS. 1 and 2, the one dimension of each closed cell 105 that is about 1 millimeter or less is a lateral thickness 115 of a wall 117 of the closed cell 105. In other embodiments, the lateral thickness 115 is less than about 1 micron.

For the embodiment shown in FIGS. 1-2, each closed cell 105 prescribes a hexagonal shape and shares their walls 117. Other embodiments of the closed cell 105 can prescribe circular, square, octagonal or other geometric shapes, and could be independent structures that do not share walls. It is not necessary for each of the closed cells 105 to have shapes and dimensions that are identical to each other, although this is preferred in some embodiments of the apparatus 100, for ease of manufacture and to provide a surface with uniform wettability properties.

The closed cells 105 are configured to hold medium 120 therein. E.g., for the apparatus 100 illustrated in FIG. 1, each of the closed cells 105 hold a medium 120 (e.g., a gas) therein. As also shown in FIG. 1, the apparatus 100 further comprises a foam 125 that contacts the closed cells 105. The foam 125 has fluid walls 130 that include a surfactant 132, and individual bubbles 135 of the foam 125 are filled with the medium 120. For the embodiment depicted in FIG. 1, the foam layer 125 is located between the closed cells 105 and a fluid 140 (e.g., water) located over the closed cells 105. The fluid 140 can also contain the medium 120 and surfactant 132 dissolved therein.

In some preferred embodiments of the apparatus 100, the foam 125 has a static foam layer 145. That is, the individual bubbles 135 of static foam layer 145 remain substantially stationary on the closed cells 105 for an extended period. E.g., in preferred embodiments, each bubble 135 of the foam layer 145 is associated with a particular closed cell 105 for a period, of on average, at least about 1 minute, and in some cases about 15 minutes. Even more preferably, there is a static foam layer 145 when the fluid 140 and substrate 112 are moving relative to each other (e.g., fluid 140 is moving over the substrate's surface 110, or, the substrate 112 is moving through the fluid 140). In other embodiments, however, the foam 125 is transient. In such cases, the bubble 135 of the foam 125 are associated with the closed cells 105 for brief periods, e.g., less than 1 minute, and in some cases less than 1 second. Preferably in such embodiments, the foam 125 is continuously replenished as old bubbles 135 pinch-off and enter the bulk of the fluid 140.

As also illustrated for the embodiment shown in FIG. 1, at least a portion 147 of the fluid walls 130 is substantially parallel to walls 117 of the closed cells 105. That is, the fluid walls 130 project orthogonally out from the surface 110 and thereby continue the walls 117 of the closed cells 105 so that the closed cells 105 are separated from the fluid 140. In other embodiments, the bubbles 135 can be substantially spherical.

In some cases, the formation of the foam 125 depends upon having the medium 120 and surfactant 132 present in the fluid 140. In particular, to form a static foam layer 145 it is important, and in some cases critical, to have certain concentrations of surfactant 132 and medium 120 in the fluid 140.

It has not been previously recognized that adding a surfactant and medium to a fluid can reduce the flow resistance experienced by a micro- or nanostructured surfaces moving with respect to the fluid. Consequently, the concentrations of medium and surfactant in the fluid are not previously recognized result-effective variables with respect to reducing flow resistance.

It is important to have enough surfactant 132 in the fluid 140 so that there will be sufficient numbers of surfactant molecules 150, each comprising polar end 152 and non-polar end 154, to form a continuous layer of molecules 150 at the interface 155 between the fluid 140 and the medium 120 inside of the foam 125. On the other hand, it is important to avoid excessive amounts of surfactant 132, because too much of surfactant 132 can result in the formation of micelles, which could interfere with the stability of the fluid walls 130 separating neighboring bubbles 135. E.g., in some preferred embodiments, the concentration of surfactant molecules 150 in the fluid 140 ranges from about 0.1 to 1 wt percent.

In some cases, it is also important to have sufficient amounts of medium 120 in the fluid 140 to promote foam formation. In particular, in some embodiments, it is desirable for the amount of medium 120 dissolved in the fluid 140 to be enough to exceed a certain critical pressure of the medium 120 in the closed cell 105. When the amount of medium 120 in the fluid 140 exceeds the critical pressure, then bubbles 135 will form at the interface 155, and merge to form the foam 125.

The critical pressure of the medium 120 in the closed cells 105 depends upon the surface tension of the fluid 140, as well as the diameter 107 of the closed cells 105. In some preferred embodiments, the pressure of the medium 120 in the fluid 140 is equal to or greater than the critical pressure. This can be the case, when e.g., when the medium 120 dissolved in the fluid 140 is in equilibrium with the medium 120 in the closed cells 105. However, in other cases, such as when the medium 120 is introduced into the cells 105 via the openings 160, the pressure of the medium 120 dissolved in the fluid 140 can be less than the critical pressure. The critical pressure of the medium 120 in the closed cell 105 is given by: $4 \cdot \gamma / d$, where $\gamma$ equals the surface tension of the medium 120 in the fluid 140 and d equals a diameter 107 of the closed cells 105. Consider as an example, embodiments where the fluid 140 is water and the medium 120 in nitrogen, and the diameter 107 of the closed cell equals about 10, 15 or 25 microns. Then the pressure of the medium 120 in the fluid 140 preferably exceeds the critical pressures for such embodiments: about 216, 144 or 86 Torr, respectively.

It is undesirable, however, to have grossly excessive amount of medium 120 in the fluid 140, because this will deter the formation of a static foam layer 145. E.g., in some embodiments, the amount of medium 120 in the fluid 140, is no more than about 10 percent above the critical pressure. In cases where the amount of medium 120 in the fluid 140 greatly exceeds the critical pressure (e.g., more than 10 percent above the critical pressure), the medium 120 will continue to diffuse from the fluid 140 into the bubbles 135. This causes the bubbles 135 to grow until the surfactant 132 can no longer stabilize the fluid walls 130, and the bubbles 135 merge together and detach from the surface, causing the foam 125 to break down. The foam 125 will then reassemble at the interface 155 between the fluid 140 and the medium 120, and the entire process repeats itself.

In some embodiments, the surface 110 of the substrate 112 has openings 160 therein that couple each of the closed cells 105 to a source 170 of the medium 120. E.g., as illustrated in FIG. 1, the source 170 can comprise a chamber 172 filled with the medium 120 and coupled to the openings 160. The amount of medium 120 fed into the cells 105 form the source can be controlled with a regulator 174 (e.g., a valve). In such embodiments, it is desirable to adjust the pressure of medium 120 fed from the source 170 into the cells 105 so as to exceed the critical pressure. In still other cases, the apparatus 100 can be configured to electrolytically convert portions of the fluid 140 into additional medium 120, such as described in U.S. patent application Ser. No. 11/227,735, which is incorporated by reference herein in its entirety.

As noted above in the context of FIG. 1, each surfactant molecule 150 preferably has a polar end 152 and a non-polar end 154. E.g., in some preferred embodiments, the surfactant molecules 150 comprise anionic surfactants (e.g., sodium dodecyl sulfate), cationic surfactants (e.g., polyethoxylated tallow amine), non-ionic surfactants (e.g., cetyl alcohol), or amphoteric (zwitterionic) surfactants.

In some preferred embodiments, such as when the surfactant 132 comprises ionic surfactant molecules 150 (e.g., sodium dodecyl sulfate), the polar end 152 contacts the fluid 140 (e.g., a polar fluid such as water) and the non-polar end 154 contacts the medium 120 (e.g., a non-polar medium such as air) located inside of the foam 125. E.g., as shown in FIG. 1, the fluid walls 130 preferably each comprise two layers 180, 182 of surfactant molecules 150, each layer 180, 182 having polar ends 152 of the surfactant molecules 150 in contact with the fluid 140, and a non-polar end 154 in contact with the medium 120 located inside of the foam 125. In other embodiments, however, different types of surfactants 132 (e.g. amphoteric or nonionic surfactants) can be used. In such cases, although there may be more complex arrangement of the surfactant molecules 150 relative to the fluid 140 and medium 120, the surfactants 132 has same desired influence on the foam stability.

The surfactant 132 plays an important role of stabilizing the fluid walls 130, by preventing the individual bubbles 135 of the foam 125 from merging and coalescing. It is believed that the stability conferred to fluid walls 130 is due at least in part to the repulsive forces between surfactant molecules 150 and attractive forces between the surfactant molecules 150 and the medium 120 and fluid 140. As illustrated for the embodiment depicted in FIG. 1, the surfactant molecules 150 self-assemble to form continuous layers 180, 182 at the interface 155 between the fluid 140 and the medium 120. The polar ends 152 of the surfactant molecules 150 in each of the two layers 180, 182 are opposed to each other and separated by a small thickness 185 (e.g., about 1 micron or less) of the fluid 140. Because the polar ends 152 of the surfactant molecules 150 repel each other, the fluid walls 130 are prevented from further thinning and are thus stabilized. As further illustrated, the individual bubbles 135 can have a diameter 187 that is substantially equal to the diameter 107 of the closed cells 105. Preferably, the bubbles 135 are substantially uniform is size.

Another aspect of the invention is a method of use. E.g., embodiments of the apparatus of the present invention can be used in methods where it is desirable to control the flow resistance. FIGS. 3-4 and 5-6 present cross-sectional views of example apparatuses 300, 500 at various stages of a use that comprises controlling the flow resistance of a fluid disposed over a surface of a substrate. The views are analogous to the view presented in FIG. 1 but at lower magnification. Any of the various embodiments discussed above and illustrated in FIGS. 1-2 could be used in the method. FIGS. 3-4 and 5-6 use the same reference numbers to depict analogous structures to that shown in FIGS. 1-2.

Figure 3:
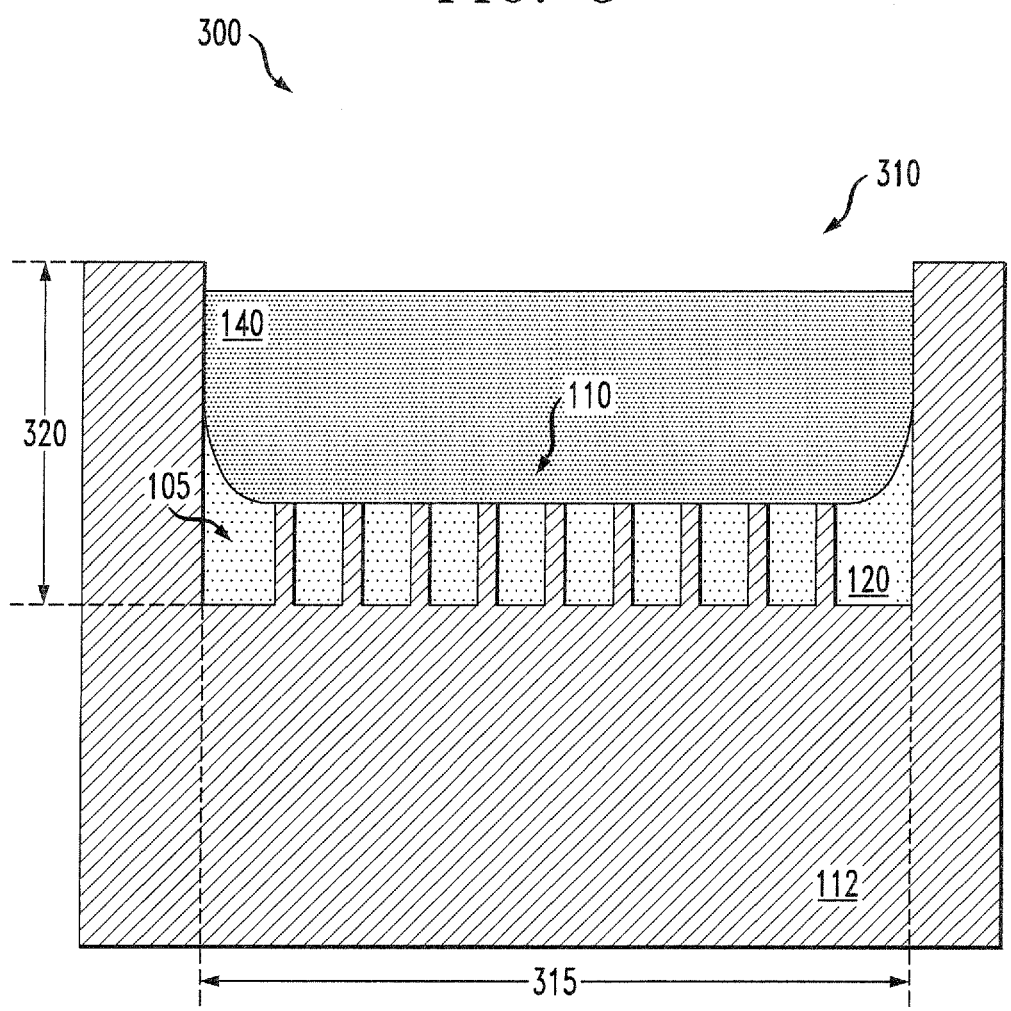
FIGS. 3 and 4 present cross-sectional views of an example apparatus at various stages of a method of use according to the principles of present invention.
Figure 4:
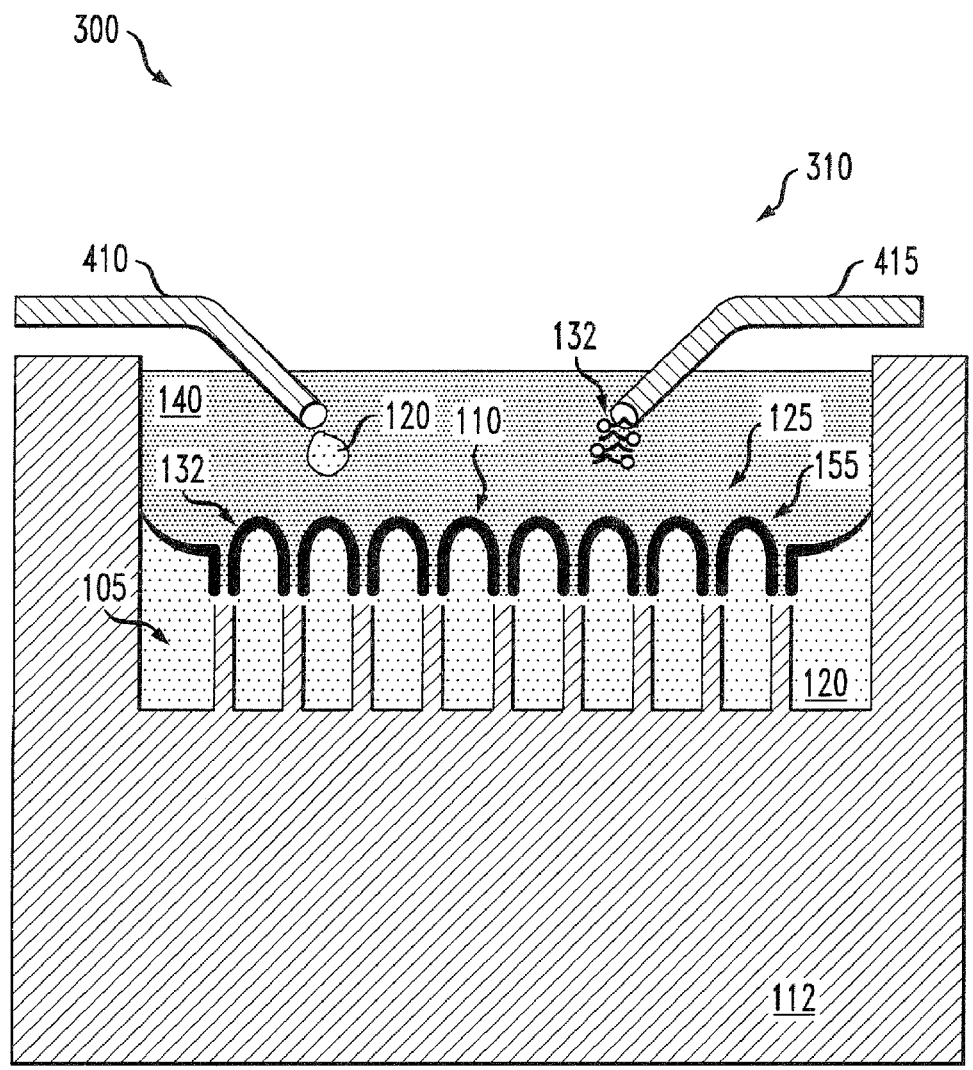

In some cases, such as discussed in the context of FIGS. 3-4, the method is used to control flow resistance in an apparatus 300 while transporting a fluid through a channel. FIG. 3 presents a cross-sectional view of an example apparatus 300 after contacting a fluid 140 with a plurality of closed cells 105 disposed on a surface 110 of a substrate 112. The closed cells 105 are nano- or microstructured closed cells. That is, each of the closed cells 105 has at least one dimension that is less than about 1 micron or millimeter, respectively.

For the embodiment depicted in FIG. 3, the apparatus 300 is configured as a microfluidic device, and the substrate 112 is configured to comprise a channel 310 of the device. Contacting the fluid 140 with the closed cells 105 may occur by putting the fluid 140 on or in the apparatus 300, e.g., in or on the channel 310. As shown in FIG. 3, the closed cells 105 can correspond to an interior surface 110 of the channel 310 that is configured to transport a fluid 140. The substrate 112 comprises at least a portion of the structure that defines the channel 310. The microfluidic device has at least one dimension that is about 1 millimeter or less. For instance, one or both the width 315 and height 320 of the channel 310 can be about 1 millimeter or less. As illustrated in FIG. 3, the fluid 140 contacts the closed cells 105, resulting in a high flow resistance when, e.g., the fluid 140 is traveling through the channel 310.

FIG. 4 presents a cross-sectional view of the apparatus 300 after adjusting amounts of a surfactant 132 and a medium 120 in the fluid 140 to thereby form a foam 125 between the fluid 140 and the closed cells 105. As a result, there is less flow resistance for the fluid 140 passing through the channel 310. E.g., in some preferred embodiments, forming the foam 125 allows the fluid 140 to flow at a faster rate through the channel 310 for a predefined pressure head applied to the channel 310, as compared to when the fluid 140 is in contact with the closed cells 105 with no foam 125 there-between (e.g., such as shown in FIG. 3). In some cases, forming the foam 125 results in a slip-interface 155 between the fluid 140 and the medium 120, with a consequent reduction in flow resistance. In such cases the fluid 140, at the very bottom of the fluid wall 130 adjacent to the walls 117 of the cells 105 (FIG. 1), has a velocity of zero due to the non-slip interface between the fluid wall 130 and the solid walls 117.

As illustrated in FIG. 4, one or more conduits 410, 415 (e.g., pipes) may be coupled to the channel 310. The conduits 410, 415 are configured to transfer the surfactant 132 and medium 120 into the fluid 140. In cases where the medium 120 comprises a gas (e.g., air) a certain amount of the medium 120 gets dissolved in the fluid 140. At a later stage, the dissolved gas diffuses into the cells 105 and causes the bubbles 135 of the foam 125 to grow. In some cases predefined amounts of surfactant 132 and medium 120 are introduced into the fluid 140 to achieve the desired reduction in flow resistance, and corresponding increase in flow rate. In other cases, the amounts of surfactant 132 and medium 120 required to produce a particular reduction in flow resistance are not known. In such instances, one or both of the amounts of the surfactant 132 and medium 120 introduced into the fluid 140 can be incrementally adjusted while the flow rate of fluid 140 in the channel 310 is monitored. In some cases, the amounts of surfactant 132 and medium 120 may be reduced to cause an increase in flow resistance, and corresponding decrease in flow rate.

Figure 5:
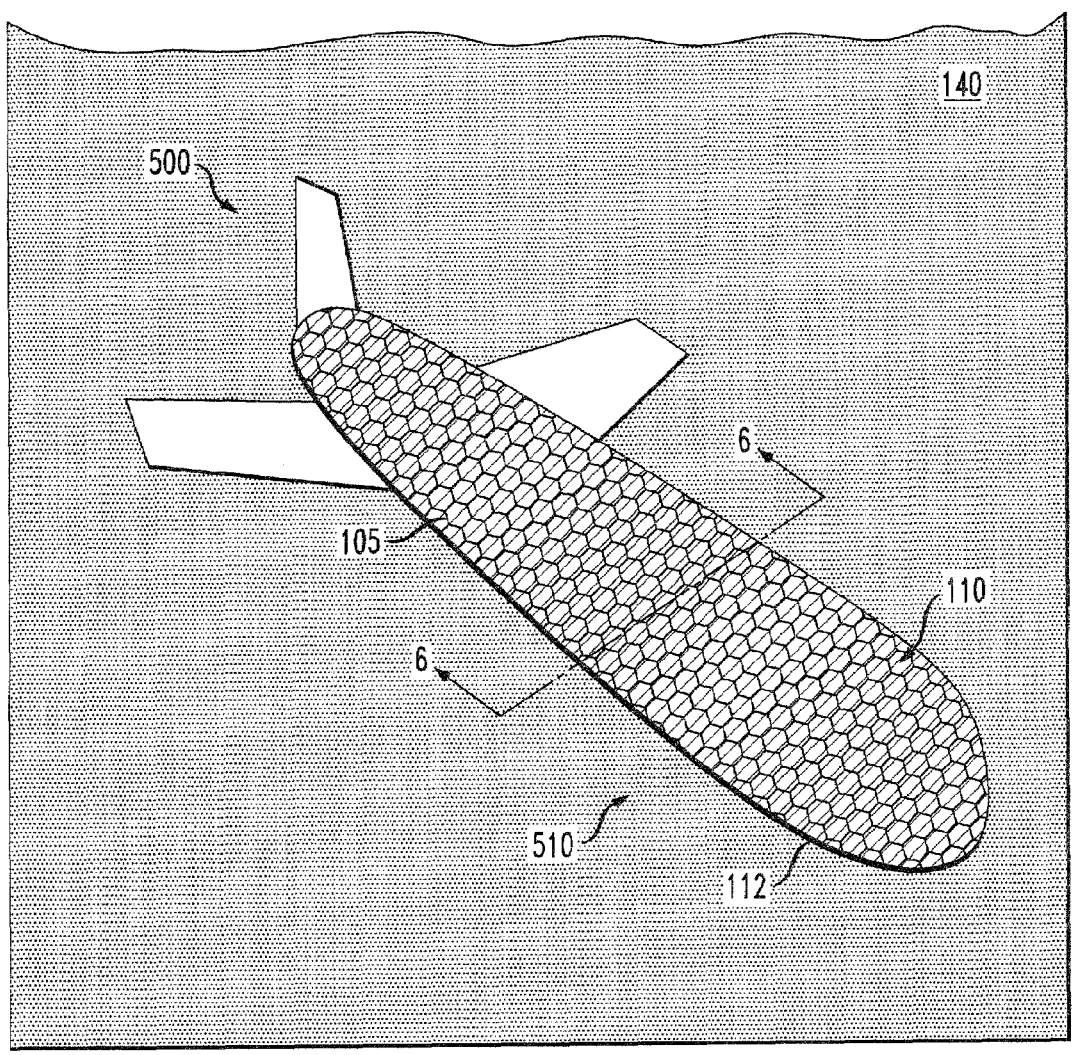
FIGS. 5 and 6 present perspective and cross-sectional views of an example apparatus at various stages of a method of use according to the principles of the present invention.
Figure 6:
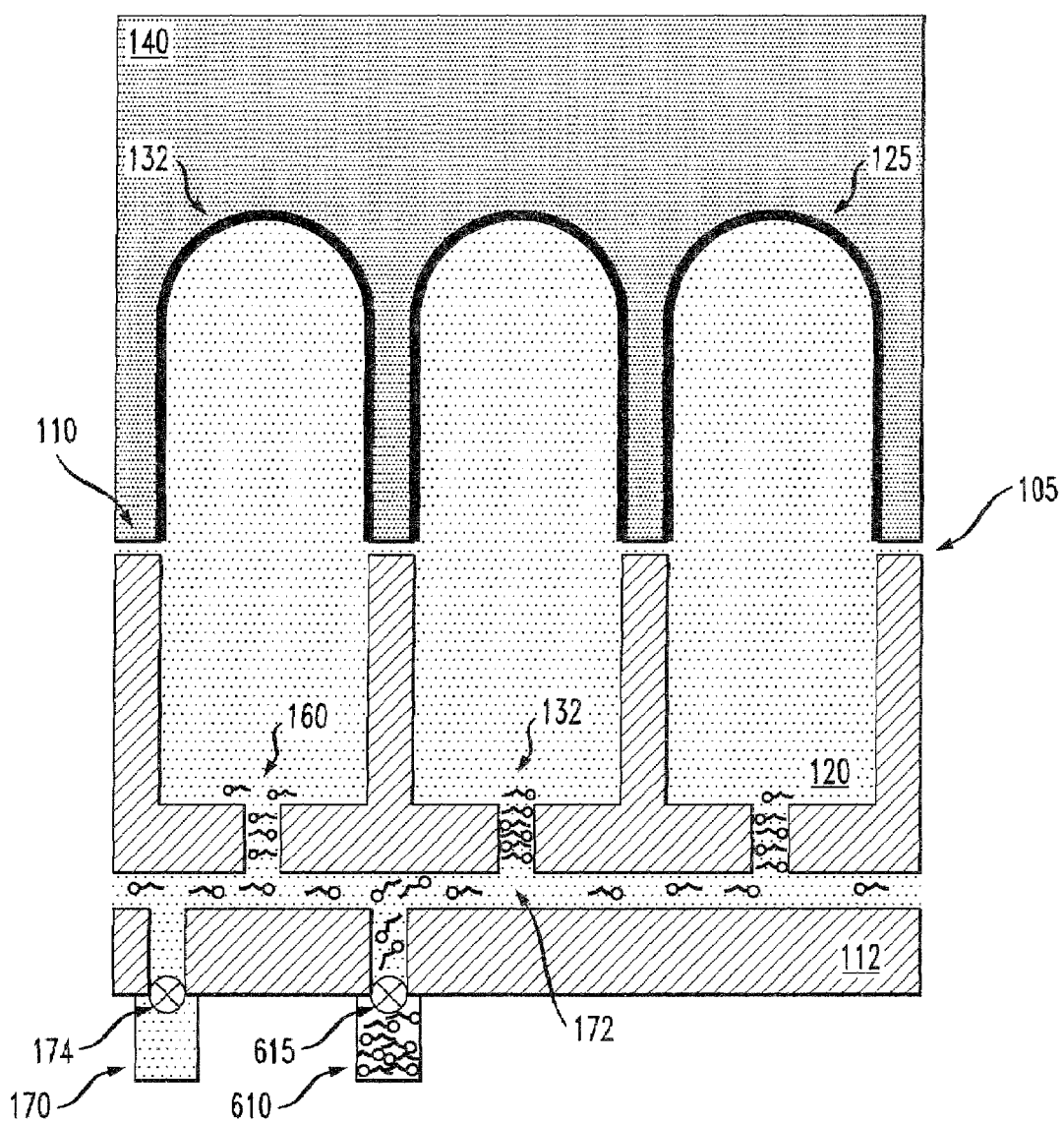

In other cases, such as illustrated in FIGS. 5-6, the method is used to control flow resistance in an apparatus, such as a vehicle, moving through a fluid. That is, controlling flow resistance is done while moving a body through the fluid, the body having an exterior surface covered with the closed cells. FIG. 5 presents a perspective view of another example apparatus 500 after contacting a fluid 140 with a plurality of closed cells 105 disposed on a surface 110 of a substrate 112. Again, closed cells 105 are nano- or microstructured closed cells. For the embodiment depicted in FIG. 5, the apparatus 500 is configured as a vehicle, such as an on-water or underwater vehicle, and the substrate 112 comprises at least a portion of a body 510 of the apparatus 500. As shown in FIG. 5, the substrate surface 110 is an external surface of the body 510. The body 510 is configured to move through or on the fluid 140. In some cases, for example, the body 510 comprises a hull of the vehicle. Contacting the fluid 140 with the cells 105 may occur by putting the apparatus 500 on or in the fluid 140. As discussed in the context of FIG. 3, when the fluid 140 contacts the closed cells 105 without the presence of the foam 125, there results a high flow resistance when, e.g., the body 510 is traveling through the fluid 140.

FIG. 6 presents a cross-sectional view of the apparatus 500 (along view line 6-6 in FIG. 5) after adjusting amounts of a surfactant 132 and a medium 120 in the fluid 140 to thereby form a foam 125 between the fluid 140 and the closed cells 105. In some preferred embodiments, forming the foam 125 allows the body 510 to travel through the fluid 140 with less drag for a given propulsive force applied to the body 510, as compared to when the fluid 140 is in contact with the closed cells 105 with no foam 125 there-between (e.g., analogous to that shown in FIG. 3). As further illustrated in FIG. 6 in some cases adjusting amounts of a surfactant 132 and a medium 120 in the fluid 140 comprises introducing one or both of the surfactant 132 and medium 120 into the closed cells 105 through openings 160 in the substrate's 112 surface 110. This can be advantageous when the foam 125 comprises a transient foam, and it is desirable to continuously replenish the surface 110 of the substrate 112 with bubbles 135 (FIG. 1) of the foam 125. As discussed in the context of FIG. 1, the medium 120 can be introduced in a controlled fashion from a medium source 170 coupled to the openings 160 via a chamber 172 and regulator 174. Preferably, the amount of medium 120 introduced into the closed cells 105 through the openings 160 is sufficient to exceed a critical pressure of the medium 120 in the closed cells 105. Likewise, the surfactant 132 can be introduced in a controlled fashion from a surfactant source 610 and regulator 615 coupled to the openings 160. The surfactant 132 can be introduced via the same chamber 172 as used for introducing the medium 120, or via a separate chamber.

Yet another embodiment of the present invention is a method of manufacture. FIGS. 7-10 illustrate cross-sectional views of selected stages in an exemplary method of manufacturing an apparatus 700 according to the principles of the present invention. Any of the above-discussed embodiments of the apparatuses shown in FIG. 1-6 can be made by the method. The same reference numbers are used to depict analogous structures presented in FIGS. 1-6.

Figure 7:
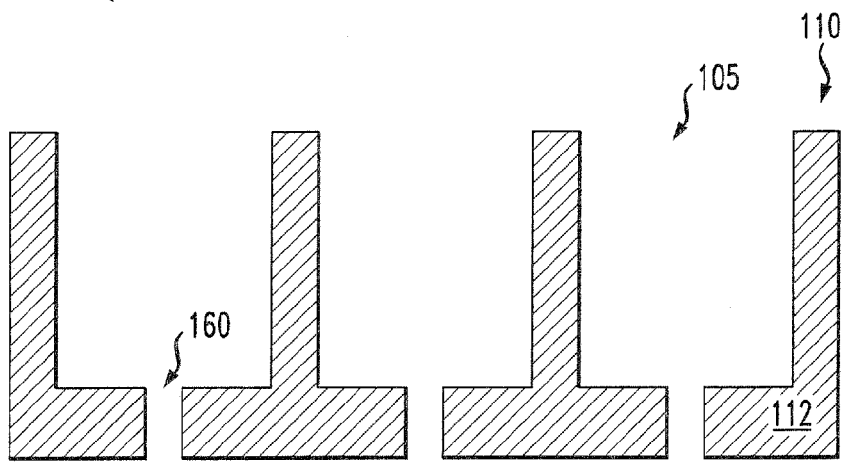
FIGS. 7-10 illustrate cross-sectional views of selected stages in an exemplary method of manufacturing an apparatus according to the principles of the present invention.

FIG. 7 shows the partially-completed apparatus 700 after providing a substrate 112 and forming closed cells 105 in the substrate 112, such as discussed in U.S. patent application Ser. No. 11/227,663, which is incorporated by reference herein in its entirety. For instance, the closed cells 105 can be formed on a surface 110 of the substrate 112 using conventional photolithographic and wet or dry etching procedures, or by drilling into the substrate 112. E.g., forming the closed cells 105 can include deep reactive ion etching the substrate 112 or other procedures well-known to those skilled in the art.

As further illustrated in FIG. 7, in some cases, openings 160 are formed in the surface 110 of the substrate 112. The same procedures can be used to form the openings 160 as used to form the closed cells 105. Preferably, each closed cell 105 has at least one opening 160 formed therein.

Figure 8:
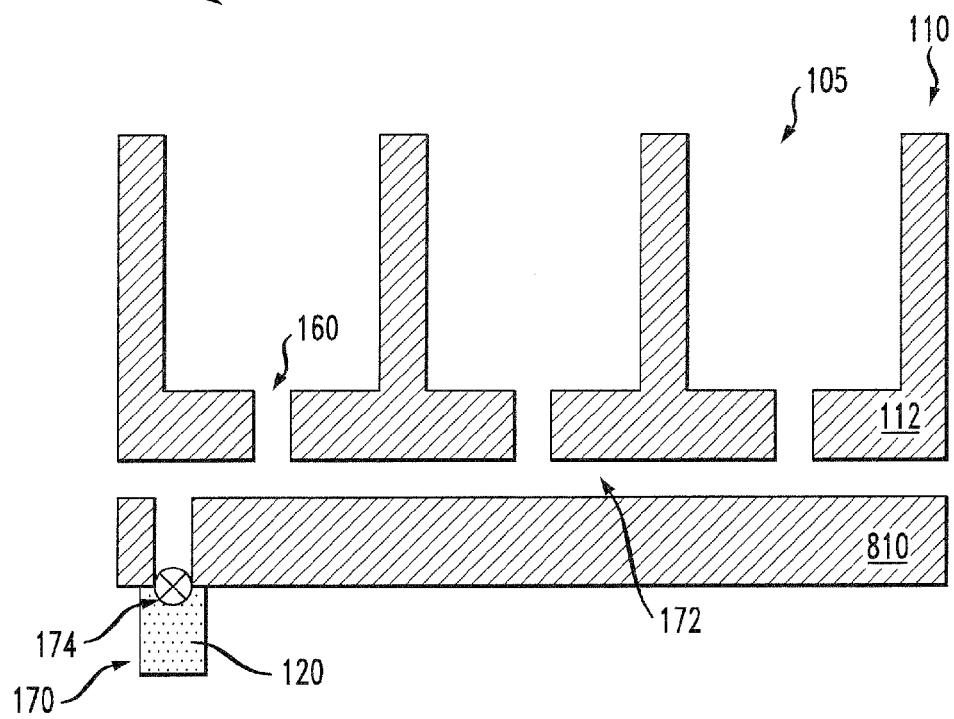

In some cases, as illustrated in FIG. 8, the substrate 112 is then coupled to a second substrate 810 in which a chamber 172 has been formed. The first and second substrates are coupled such that the openings 160 are in communication with the chamber 172. As further illustrated the chamber 172 can be coupled to a source 170 of medium 120 (e.g., a tank of nitrogen gas), which further includes a regulator 174 configured to control the introduction of medium 120 into the cells 105. In some cases, analogous elements are present to facilitate the introduction of surfactant.

Figure 9:
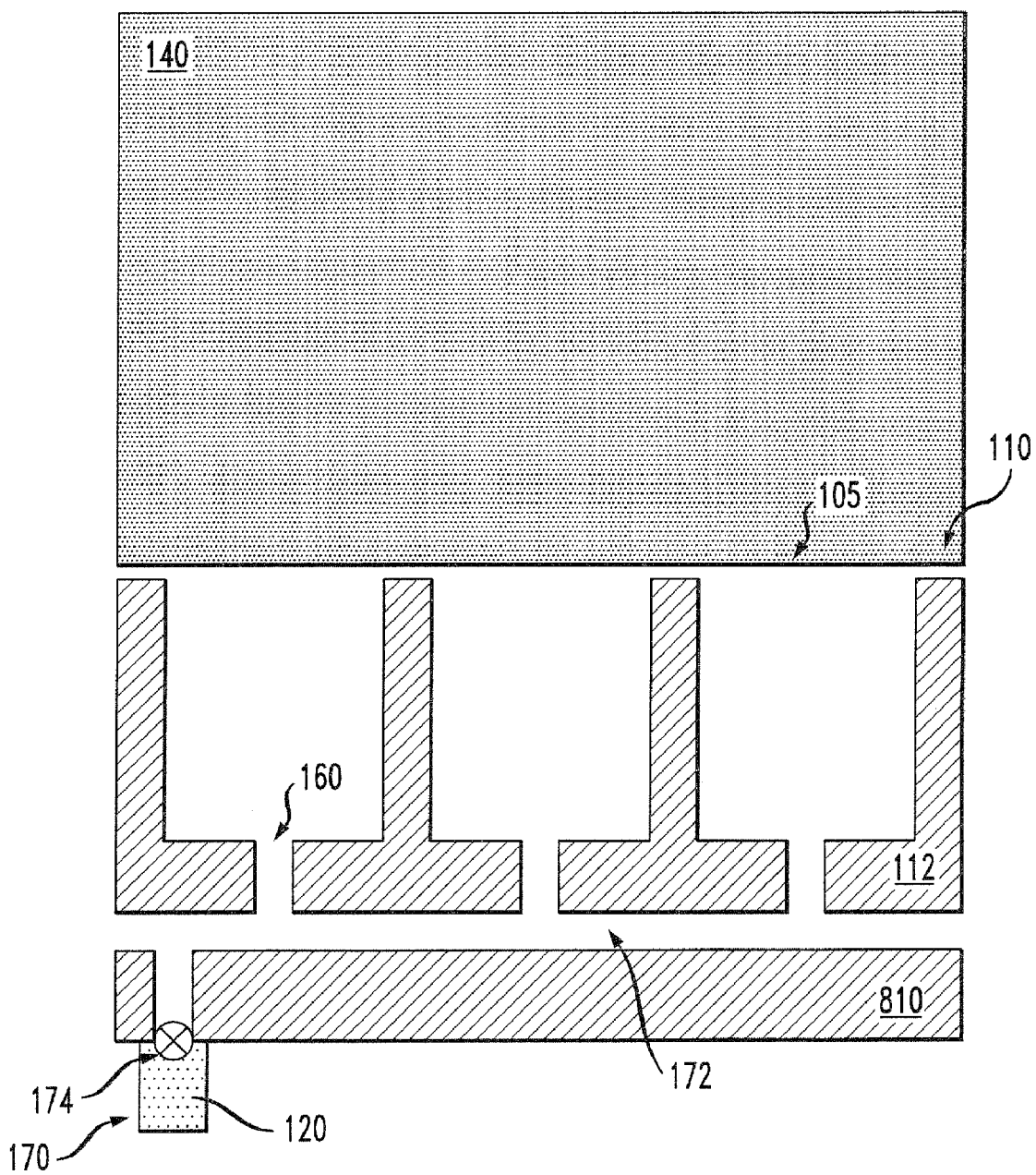

FIG. 9 shows the partially-completed apparatus 700 after contacting the closed cells 105 with a fluid 140, e.g., by disposing the fluid 140 on the substrate's surface 110, or by putting the substrate 112 in the fluid 140. As illustrated in FIG. 9, in the absence of surfactant and medium, the bulk fluid 140 will directly contact the closed cells 105.

Figure 10:
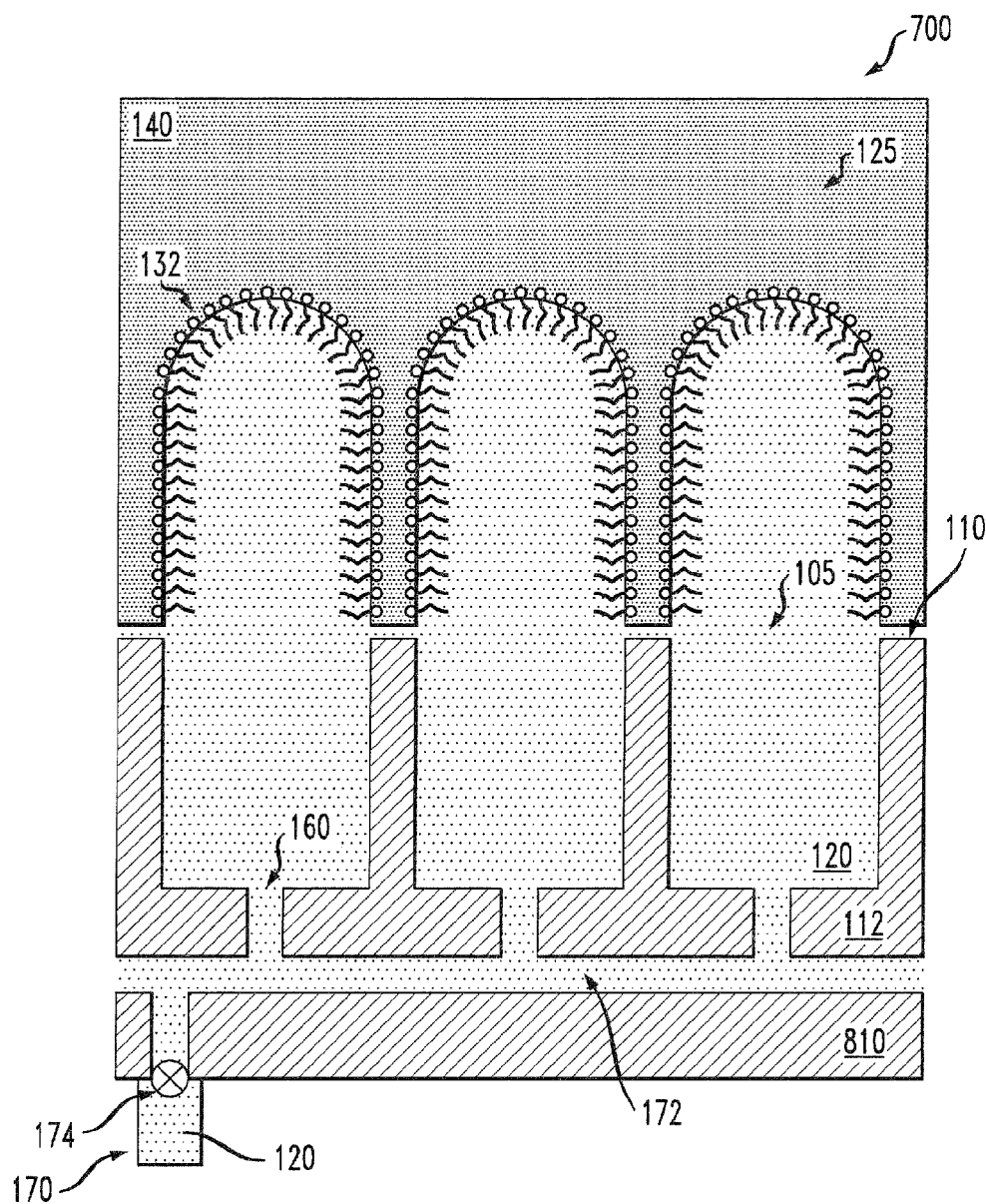

FIG. 10 shows the partially-completed apparatus 700 after introducing a surfactant 132 and a medium 120 into the fluid 140 such that a foam 125 forms between the fluid 140 and the closed cells 105. The medium 120 and surfactant 132 can be introduced directly into the fluid 140 or via the optional openings 160 formed in the substrate 112. In preferred embodiments, introducing the medium 120 includes dissolving an amount of medium 120 in the fluid 140 so as to exceed a critical pressure of the medium 120 in the closed cells 105. E.g., in some cases a partial pressure of the medium 120 (e.g., $N_2$ gas) in the fluid 140 (e.g., liquid $H_2O$) ranges from about 86 to 216 Torr and a concentration of the surfactant 132 (e.g., sodium dodecyl sulfate) in the fluid 140 ranges from about 0.1 to 1 wt percent.

Although the present invention has been described in detail, those of ordinary skill in the art should understand that they could make various changes, substitutions and alterations herein without departing from the scope of the invention.

What is claimed is:

1. An apparatus, comprising:
a plurality of cells on a substrate, wherein each of said cells has at least one dimension that is less than about 1 millimeter and is configured to hold a medium therein, and wherein each of said cells has walls that laterally enclose an area of a surface of said substrate and has a top opening; and
a foam layer contacting said walls of said cells, wherein:
bubbles of said foam layer have fluid walls that include a surfactant,
said bubbles are filled with said medium, and
said bubbles remain substantially stationary on said top openings of the cells for a period on average of at least about 1 minute.

2. The apparatus of claim 1, wherein said surfactant comprises surfactant molecules having a polar end and a non-polar end, wherein said polar end contacts said fluid and said non-polar end contacts said medium located inside of said foam.

3. The apparatus of claim 1, wherein said fluid walls comprises two layers of surfactant molecules, each layer having a polar end of said surfactant molecules in contact with said fluid and a non-polar end in contact with said medium located inside of said foam.

4. The apparatus of claim 3, wherein said polar ends of said surfactant molecules in each of said two layers are opposed to each other and separated by said fluid.

5. The apparatus of claim 1, wherein individual bubbles of said foam layer have a diameter that is substantially equal to a diameter of said cells.

6. The apparatus of claim 1, wherein said surfactant comprises ionic surfactant molecules.

7. The apparatus of claim 1, wherein a concentration of surfactant molecules in said fluid ranges from about 0.1 to 1 weight percent.

8. The apparatus of claim 1, wherein said fluid comprises water and said medium comprises nitrogen.

9. The apparatus of claim 1, wherein said surface has openings therein that couple each of said cells to a source of said medium.

10. The apparatus of claim 1, wherein an amount of medium dissolved in said fluid is sufficient to exceed a critical pressure of said medium in said cells.

11. The apparatus of claim 1, wherein a pressure of said medium in said fluid is equal to or greater than $4\cdot\gamma/d$, where $\gamma$ equals a surface tension of said fluid and d equals a diameter of said cells.

12. The apparatus of claim 1, wherein said foam layer is present when at least one of said fluid and said substrate are moving relative to each other.

13. The apparatus of claim 1, wherein a partial pressure of said medium in said fluid ranges from about 86 to 216 Torr and a concentration of said surfactant in said fluid ranges from about 0.1 to 1 weight percent.

* * * * *